United States Patent [19]

Gandolfi et al.

[11] Patent Number: 4,615,478

[45] Date of Patent: Oct. 7, 1986

[54] METHOD FOR THE SOLDERING OF SEMICONDUCTOR CHIPS ON SUPPORTS OF NOT-NOBLE METAL

[75] Inventors: Luciano Gandolfi, Corsico; Antonio Grasso, Catania; Antonio Perniciaro, Palermo, all of Italy

[73] Assignee: SGS-ATES Componenti Elettronici S.p.A., Catania, Italy

[21] Appl. No.: 503,256

[22] Filed: Jun. 10, 1983

[30] Foreign Application Priority Data

Nov. 19, 1982 [IT] Italy ............................. 24328 A/82

[51] Int. Cl.$^4$ ........................ B23K 1/20; B23K 35/28
[52] U.S. Cl. .................................. 228/123; 228/220; 228/232; 228/245
[58] Field of Search ............... 228/123, 220, 119, 200, 228/211, 232, 219, 207, 208, 245

[56] References Cited

U.S. PATENT DOCUMENTS

| | | | |
|---|---|---|---|
| 3,132,419 | 5/1964 | Takikawa | 228/123 |
| 3,136,032 | 6/1964 | Berndsen | 228/123 |
| 3,217,401 | 11/1965 | White | 228/123 |
| 3,555,669 | 1/1971 | Tarn | 228/123 |
| 3,665,590 | 5/1972 | Percival | 228/220 |
| 3,665,594 | 5/1972 | Raithel | 228/123 |
| 3,735,911 | 5/1973 | Ward | 228/119 |
| 3,744,121 | 7/1973 | Nagano | 228/123 |
| 3,883,946 | 5/1975 | Dale | 228/123 |
| 3,923,609 | 12/1975 | Welch | 228/123 |
| 4,019,671 | 4/1977 | Akuerek | 228/123 |

*Primary Examiner*—Kenneth J. Ramsey
*Assistant Examiner*—Christopher L. McKee
*Attorney, Agent, or Firm*—Cushman, Darby & Cushman

[57] ABSTRACT

After the support of not-noble metal has suitably been heated and before and during the application of a tablet of soldering material destined to receive the semiconductor chip, the soldering area is engaged by a reducing gas flame (for example, 20% hydrogen and 80% nitrogen at a temperature lower than 570° C.), which eliminates any oxidation products. The soldering is thus of very good quality without using the normal plating of noble metal.

5 Claims, No Drawings

METHOD FOR THE SOLDERING OF SEMICONDUCTOR CHIPS ON SUPPORTS OF NOT-NOBLE METAL

The present invention relates to a method for the soldering of semiconductor chips on supports of not-noble metal.

A method presently of large use in the semiconductor field provides that a metallic support of not-noble material (preferably copper or its alloys) is submitted to a plating of noble metal (gold or silver) before the application of the so called "preform", that is of a tablet of metallic soldering material which is superimposed to the metallic support after its heating up to the melting temperature of the "preform" and in its turn is destined to receive the semiconductor chip.

The noble metal plating, necessary to avoid that the oxidation of the underneath not-noble metal prevents the obtaining of a good soldering, represents a not-negligible cost, which inevitably reflects on the cost of the finished component.

The object of the present invention is to realize a soldering method for the above mentioned use, which avoids the use of the above mentioned plating of noble metal, assuring at the same time a soldering of very good quality.

According to the invention such an object is reached by means of a soldering method, comprising in a per-se-known way the application of a tablet of soldering material on a support of not-noble metal pre-heated at the melting temperature of said tablet and the successive deposition of the semiconductor chip on the same tablet, characterized in that, immediately before and during the application of the tablet of soldering material, said metallic support is engaged by a reducing gas flame.

In other words, the method according to the invention provides that the anti-oxide function till now carried out by the noble metal plating is now assigned to a gas reducing flame which, by engaging the soldering area before and during the application of the "preform", causes the elimination of any oxidation products and thus assures the obtaining of a perfect soldering. The final technical result is therefore unchanged, but, since the use of an expensive noble metal is avoided, the process cost is evidently reduced, as well as the cost of the finished component.

Naturally it is necessary to choose with shrewdness both the kind of gas and the flame temperature, the first one in order to assure the best reducing effect, the second one in order to avoid possible contaminations of the semiconductor chip. In such sense, it is presently preferred the use of a gas based on hydrogen (for example, 20% hydrogen and 80% nitrogen) at a flame temperature lower than 570° C.

Once effected the right choice, the method according to the invention can therefore be considered applicable to semiconductor chips of various kind, both of integrated and discrete kind, such as for example a transistor.

Besides it can be used for the production of both single components and strips of components separable from each other at the end of the process.

Finally it is not to be excluded its use for the soldering of the metallic wires of the chips to the metallic contacts, which serve for the outer connection of the component.

What is claimed is:

1. A method for soldering a semiconductor component onto a non-noble metal support comprising the consecutive steps of preheating the support to the melting point of a solder material, directing a reducing gas flame onto said support, applying a solder material to the support while maintaining the reducing gas flame on the support, applying a semiconductor component to the solder thereby bonding the semiconductor component to the support.

2. Method according to claim 1, characterized in that said flame is kept at a temperature lower than 570° C.

3. Method according to claim 1, characterized in that said reducing gas is based on hydrogen.

4. Method according to claim 3, characterized in that said reducing gas is formed by 20% hydrogen and 80% nitrogen.

5. A method for bonding a semiconductor component onto a non-noble metal support having a noble metal free bonding surface to receive said semiconductor component, the method comprising the consecutive steps of preheating the support to the melting temperature of a solder, subjecting the bonding surface to a reducing flame, applying the solder to the bonding surface while maintaining the reducing flame, and applying said semiconductor component onto said bonding surface.

* * * * *